(12) United States Patent
Tsai et al.

(10) Patent No.: US 9,311,812 B2
(45) Date of Patent: Apr. 12, 2016

(54) TRANSMITTER AND TRANSCEIVER HAVING THE SAME IN AN RFID SYSTEM

(75) Inventors: Chun-Liang Tsai, Pingtung (TW); Shao-Chang Chang, Jhubei (TW)

(73) Assignee: FAVEPC INC., Jhubei, Hsinchu County (TW)

( * ) Notice: Subject to any disclaimer, the term of this patent is extended or adjusted under 35 U.S.C. 154(b) by 920 days.

(21) Appl. No.: 13/422,522

(22) Filed: Mar. 16, 2012

(65) Prior Publication Data

US 2013/0241716 A1    Sep. 19, 2013

(51) Int. Cl.
G08C 19/12    (2006.01)
G08C 17/02    (2006.01)
H04B 5/00    (2006.01)
H03G 3/30    (2006.01)

(52) U.S. Cl.
CPC .......... *G08C 17/02* (2013.01); *H03F 2200/294* (2013.01); *H03F 2200/327* (2013.01); *H03F 2200/387* (2013.01); *H03F 2200/451* (2013.01); *H03G 3/3042* (2013.01); *H04B 5/0062* (2013.01)

(58) Field of Classification Search
USPC ..................................................... 340/13.26
See application file for complete search history.

(56) References Cited

U.S. PATENT DOCUMENTS

| | | | | |
|---|---|---|---|---|
| 4,485,360 A | * | 11/1984 | Seward | H03H 7/30 333/109 |
| 4,706,086 A | * | 11/1987 | Panizza | G08G 1/0965 180/167 |
| 5,313,211 A | * | 5/1994 | Tokuda | G01S 7/024 342/44 |
| 6,472,860 B1 | * | 10/2002 | Tran | G01R 21/00 324/537 |
| 7,347,101 B2 | * | 3/2008 | Thomson | E01D 19/00 737/773 |
| 7,609,155 B2 | * | 10/2009 | HinKamp | A61B 5/1112 340/539.12 |
| 8,089,312 B2 | * | 1/2012 | Okayama | H04B 1/18 330/151 |
| 2004/0214545 A1 | * | 10/2004 | Kushima | H03G 3/3036 455/232.1 |
| 2006/0135096 A1 | * | 6/2006 | McCune | H01Q 1/243 455/127.1 |
| 2007/0296503 A1 | * | 12/2007 | Nakayama | H03F 1/30 330/296 |
| 2008/0180224 A1 | * | 7/2008 | Klapf | G06K 19/0723 340/10.4 |
| 2009/0102552 A1 | * | 4/2009 | Shiramizu | H03F 1/342 330/98 |
| 2011/0163855 A1 | * | 7/2011 | Takeuchi | G06K 7/0008 340/10.3 |

* cited by examiner

*Primary Examiner* — Naomi Small
(74) *Attorney, Agent, or Firm* — Alston & Bird LLP

(57) ABSTRACT

A transmitter in an RFID system, the transmitter includes a signal generator which has a PIN diode and generates a first signal, a directional unit connected to a cathode of the PIN diode; and an antenna connected to the directional unit, wherein the signal generator has a first terminal configured to receive a first control signal to control a frequency band of the first signal and a second terminal configured to receive a second control signal to control a modulation depth of the first signal.

4 Claims, 4 Drawing Sheets

US 9,311,812 B2

TRANSMITTER AND TRANSCEIVER HAVING THE SAME IN AN RFID SYSTEM

BACKGROUND OF THE INVENTION

The present invention relates generally to a transmitter and, more particularly, to a transceiver having the same in a radio-frequency identification (RFID) system.

RFID technology is prevalent and applied nowadays in various industries such as electronic payment, security and stock inventorying, etc. FIG. 1 shows a structure of a conventional reader 1 in an RFID system. The reader 1 may include a directional coupler 10 having four ports (101, 102, 103 and 104), an antenna 11, a transmitter portion 12 and a receiver portion 13. The transmitter portion 12 includes an oscillator 121, a surface acoustic wave (SAW) device 122, an amplifier 123, a first diode 124 and a forward power leveling controller 125. The receiver portion 13 includes a second diode 131, an amplifier 132 and a comparator 133.

A signal from the transmitter portion 12 may be sent to the antenna 11 through the directional coupler 10. However, the four-port directional coupler 10 may largely attenuate signals from the transmitter portion 12 and therefore the attenuated signals transmitted from the antenna 11 may not have sufficient power to activate an electronic tag (not shown).

Still referring to FIG. 1, the first diode 124 and the forward power leveling controller 125 form a feedback path to monitor output power and maintain an amplitude of transmitted RF signal at a desired level. Complex feedback mechanisms must be developed to help the first diode 124 and the forward power leveling controller 125 controlling the output power. Moreover, it may take lots of efforts to solve problems such as stability when designing the feedback mechanism.

It may therefore desirable to have a cost efficient device with a simplified circuit.

BRIEF SUMMARY OF THE INVENTION

Examples of the present invention may provide a transmitter in an RFID system, the transmitter includes a signal generator which has a PIN diode and generates a first signal, a directional unit connected to a cathode of the PIN diode; and an antenna connected to the directional unit, wherein the signal generator has a first terminal configured to receive a first control signal to control a frequency band of the first signal and a second terminal configured to receive a second control signal to control a modulation depth of the first signal.

Some examples of the present invention may also provide a transmitter in an RFID system, the transmitter includes a signal generator and a directional unit, the signal generator has a carrier generator, an amplifier to receive a carrier signal from the carrier generator, a PIN diode that includes an anode connected to an output of the amplifier and a bias circuit having a first terminal to receive a first control signal to control a frequency band of the carrier signal, a second terminal connected to an anode of the PIN diode and the output of the amplifier, and a third terminal connected to a cathode of the PIN diode, and the directional unit is connected to the cathode of the PIN diode.

Some examples of the present invention may also provide a transceiver in an RFID system, the transceiver has a signal generator having a PIN diode and generating a first signal, a directional unit connected to a cathode of the PIN diode; and a receiving circuit connected to the directional unit, wherein the signal generator comprises a first terminal configured to receive a first control signal to control a frequency band of the first signal and a second terminal configured to receive a second control signal to control a modulation depth of the first signal.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings.

DETAILED DESCRIPTION OF THE INVENTION

Reference will now be made in detail to the present examples of the invention, examples of which are illustrated in the accompanying drawings. Wherever possible, the same reference numbers will be used throughout the drawings to refer to the same or like parts.

Figure 2A:
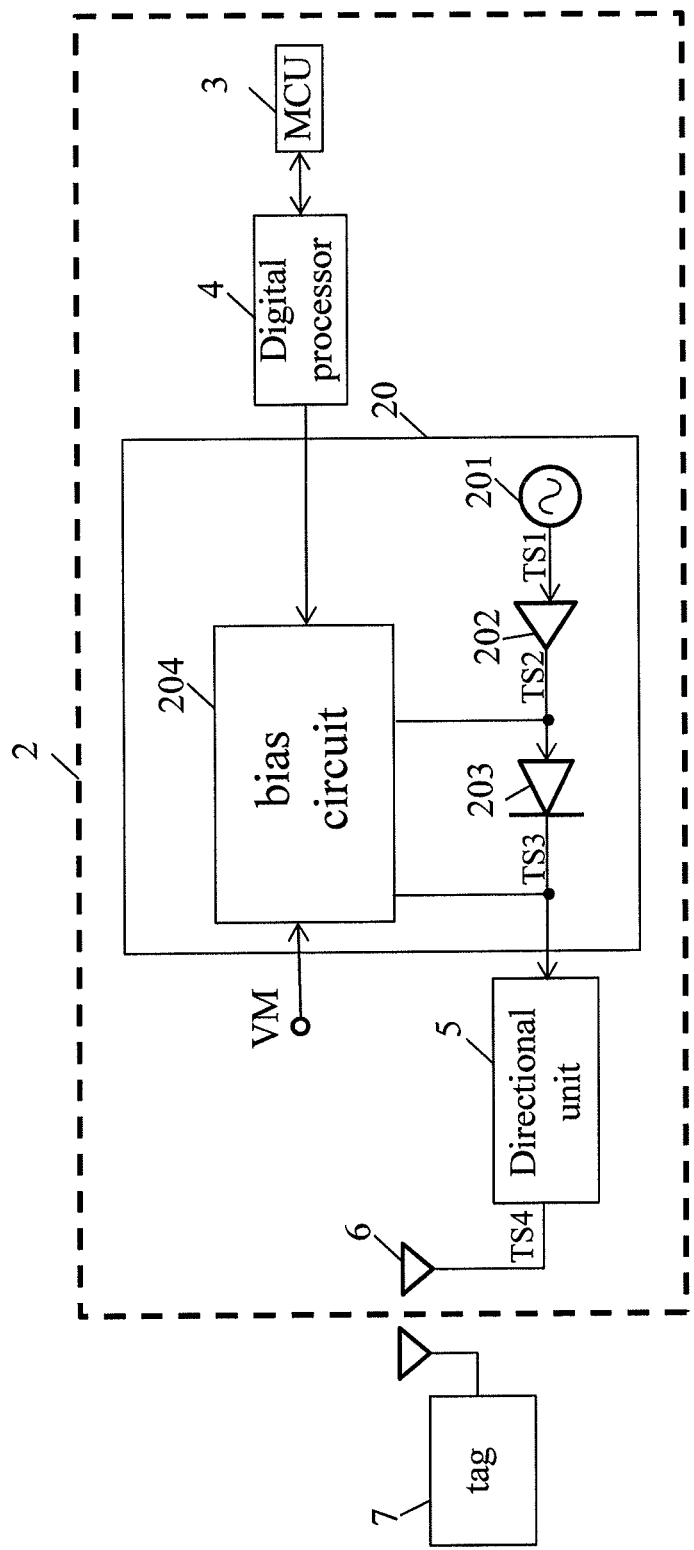
FIG. 2A is a block diagram of a transmitter 2 in an RFID system in accordance with an example of the present invention.

FIG. 2A is a block diagram of a transmitter 2 in an RFID system in accordance with an example of the present invention. Referring to FIG. 2A, the transmitter 2 may include a micro control unit (MCU) 3, a digital processor 4, a signal generator 20, a directional unit 5 and an antenna 6.

The digital processor 4 may connect to the MCU 3. The signal generator 20 may be connected between the digital processor 4 and the directional unit 5. The directional unit 5 may connect to the antenna 6 by which a signal may be sent to a tag 7. In another example, the digital processor 4 and the MCU 3 may be integrated into a control circuit (not shown).

The signal generator 20 may include a carrier generator 201, an amplifier 202, a diode 203 and a bias circuit 204. The digital processor 4 may connect to a first terminal of the bias circuit 204. A second terminal of the bias circuit 204 may connect to the anode of the diode 203 and an output of the amplifier 202. A third terminal of the bias circuit 204 may connect to the cathode of the diode 203. The amplifier 202 may have an input terminal which may connect to the carrier generator 201. The third terminal of the bias circuit 204 and the cathode of the diode 203 may connect to the directional unit 5.

The carrier generator 201 may generate a signal TS1 at a frequency $f_{ts1}$, and the signal TS1 may then be sent to the amplifier 202. The amplifier 202 may receive the signal TS1, then amplify the voltage and/or power of signal TS1 and in turn output an amplified signal TS2, which may be sent to the diode 203. In another example, the frequency $f_{ts1}$ may be but is not limited to approximately 433.92 mega hertz (MHz) and the amplifier 202 may linearly amplify the signal TS1. In yet another example, the frequency $f_{ts1}$ may be but is not limited to approximately 915 MHz.

The diode 203 may be but is not limited to a p-intrinsic-n (PIN) diode. The digital processor 4, which may be subject to the MCU 3, may send a control signal to the bias circuit 204 to change the voltage level across the diode 203, which may further vary the impedance of the diode 203. In this manner, the amplitude of signal TS2 may be changed to perform an amplitude-shift-keying (ASK) modulation on signal TS2. The diode 203 may output and send an ASK modulated signal TS3 to the directional unit 5. The directional unit 5 may process the signal TS3 and send a signal TS4 to the antenna 6. The signal TS4 may be transmitted to the tag 7 by the antenna 6.

A fourth terminal of the bias circuit 204 may connect to a terminal VM, which may supply at least one voltage level to the fourth terminal of the bias circuit 204. For example, the terminal VM may supply a relatively low voltage level to the bias circuit 204 such that the signal generator 20 may perform an ASK modulation with 75% modulation depth. In another example, the terminal VM may supply a relatively high voltage level to the bias circuit 204 such that the signal generator 20 perform an ASK modulation with 50% modulation depth. In another example, the terminal VM may be eliminated and the fourth terminal of the bias circuit 24 may connect to the digital processor 4.

Figure 2B:
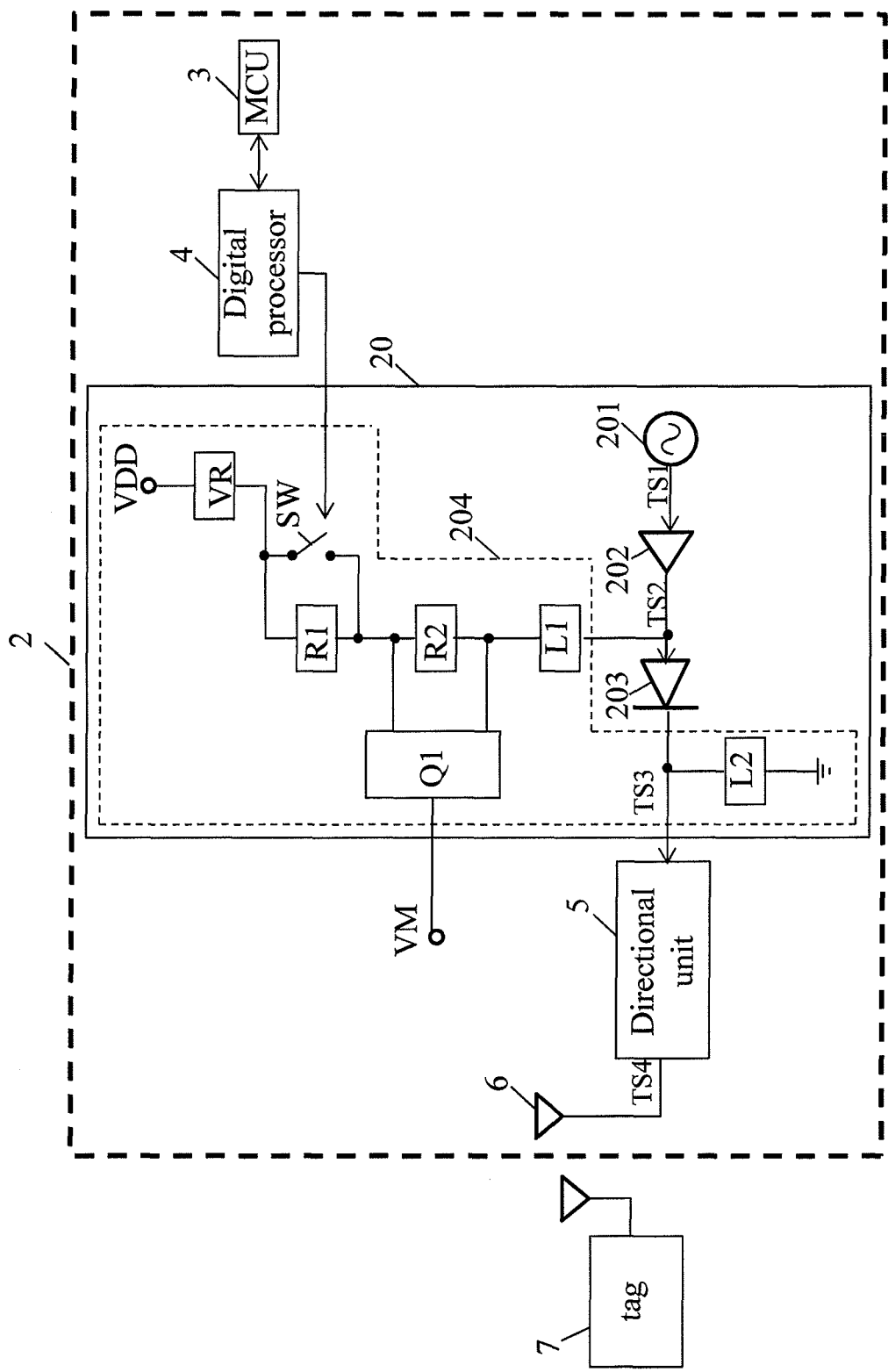
FIG. 2B is a block diagram further illustrating the transmitter 2 as shown in FIG. 2A in accordance with an example of the present invention.

FIG. 2B is a block diagram further illustrating the transmitter 2 as shown in FIG. 2A in accordance with an example of the present invention. Referring to FIG. 2B, the bias circuit 204 may include a variable resistor VR, two resistors R1 and R2, two inductors L1 and L2, a switch SW and a transistor Q1.

The variable resistor VR may have a terminal connected to a voltage terminal VDD which may supply a direct current (DC) voltage level. Another terminal of the variable resistor VR may connect to the resistor R1 and the switch SW, which are connected in parallel. The switch SW may connect to the digital processor 4. The resistor R2 may connect to the resistor R1 and the inductor L1 in series. The inductor L1 may have a terminal connected to the output of the amplifier 202 and the anode of the diode 203. The inductor L2 may have a terminal connected to the cathode of the diode 203 and the directional unit 5 and another terminal which is grounded. The transistor Q1 may have a first terminal connected to the terminal VM. The transistor Q1 may further have a second terminal and a third terminal and the resistor R2 may be connected between the second and third terminals of the transistor Q1. In one example, the transistor Q1 may be but is not limited to a complementary metal-oxide-semiconductor (CMOS) transistor. In another example, the switch SW and the transistor Q1 may be but is not limited to a transistor made by integrated circuit (IC) manufacture process.

The control signal from the digital processor 4 may be used to turn on/off the switch SW. When the switch SW is off, the signal generator 20 may perform the ASK modulation. In other words, the digital processor 4 may determine whether or not the signal generator 20 is going to perform the ASK modulation. The terminal VM may supply a relatively low voltage level to the transistor Q1 such that the signal generator 20 may perform an ASK modulation with 75% modulation depth. In another example, the terminal VM may supply a relatively high voltage level to the transistor Q1 such that the signal generator 20 perform an ASK modulation with 50% modulation depth. In another example, the terminal VM may be eliminated and the transistor Q1 may connect to the digital processor 4.

In one example, the variable resistor VR may have a resistance in the range of 100 to 50 k$\Omega$, each of the resistors R1 and R2 may have a resistance of 10 k$\Omega$, each of the inductors L1 and L2 may have an inductance of 100 Nano-Henry (nh). However, the values of the above resistance and inductance may be varied in another example to change the modulation depth.

Figure 3:
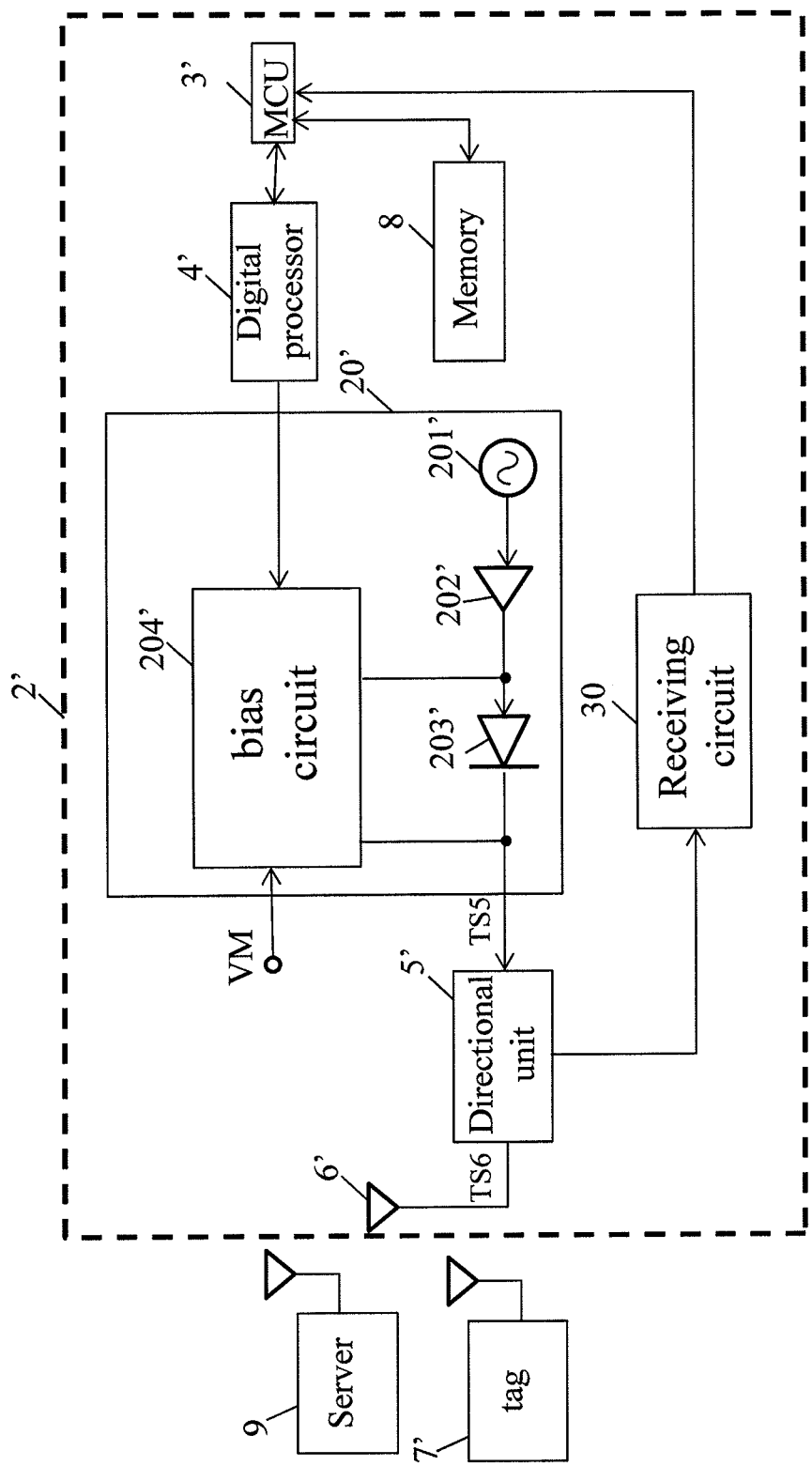
FIG. 3 is a block diagram of a transceiver 2' in an RFID system in accordance with an example of the present invention.

FIG. 3 is a block diagram of a transceiver 2' in an RFID system in accordance with an example of the present invention. Referring to FIG. 3, the transceiver 2' may include an MCU 3', a digital processor 4', a signal generator 20', a directional unit 5' and an antenna 6' which may be similar to the MCU 3, the digital processor 4, the signal generator 20, the directional unit 5 and the antenna 6 as illustrated and described with reference to FIG. 2A, except that a memory 8 and a receiving circuit 30 may be added to the transceiver 2'. The three-port direction unit 5' may not cause a huge signal attenuation as compared to the four-port directional coupler 10 of FIG. 1.

The receiving circuit 30 may be connected between the directional unit 5' and the MCU 3'. In one example, the receiving circuit 30 may be but is not limited to a detecting circuit, which may include a diode, an operational (OP) amplifier and a comparator (not shown). The diode, the OP amplifier and the comparator may be coupled in series to demodulate the received signal by the antenna 6'.

The receiving circuit 30 may rectify the received signal from the antenna 6' and remove the carrier from the rectified signal so as to obtain an envelope of the rectified signal. The receiving circuit 30 may further demodulate the envelope to generate a demodulated signal. Thereby, data contained in the received signal from the antenna 6' may be retrieved by the MCU 3'.

The memory 8 may be connected to the MCU 3'. In one example, the memory 8 may be but is not limited to a non-volatile memory and programmable. The memory 8 may include a first field that may contain a first set of identification information. The memory 8 may also have a second field that may contain a second set of identification information. The first and second sets of identification information may include but is not limited a series of numerals and/or symbols. The first set of identification information may be permanent and the second set of identification information may be changeable. In another example, the memory 8 may be replaced by two separate memories to respectively store the first set of identification information and the second set of identification information. In yet another example, the memory 8 may be integrated with the MCU 3' or the digital processor 4' into a single chip.

In one example, the MCU 3' may access the memory 8 and retrieve the first and second sets of identification information. The MCU 3' and the digital processor 4' control the signal generator 20' to generate a signal TS5 containing information relevant to the first and second sets of identification information. The directional unit 5' may process the signal TS5 and may further transmit a signal TS6 to the server 9 through the antenna 6'. In another, the signal TS5 may be transmitted to the server 9 by another interface such like Ethernet, universal serial bus (USB) or Bluetooth. In still another example, MCU 3' retrieves the first and second sets of identification information and transmits to server 9 by wired or wireless link, such like an USB or Bluetooth interface.

The server 9 may identify the first and/or second set of identification information. If the identification information is identified, the server 9 may use the first and/or second sets of identification information to generate a third set of identification information. The server 9 may send a signal containing the third set of identification information to the transceiver 2', in which such signal may be demodulated by the receiving circuit 30 so that the MCU 3' may retrieve the third set of identification information and store the said information in the second field of the memory 8. The third set of identification information may be used to identify the transceiver 2' in the next communication. By this manner, the transceiver 20' is authenticated during information uploading or downloading process.

Figure 1:
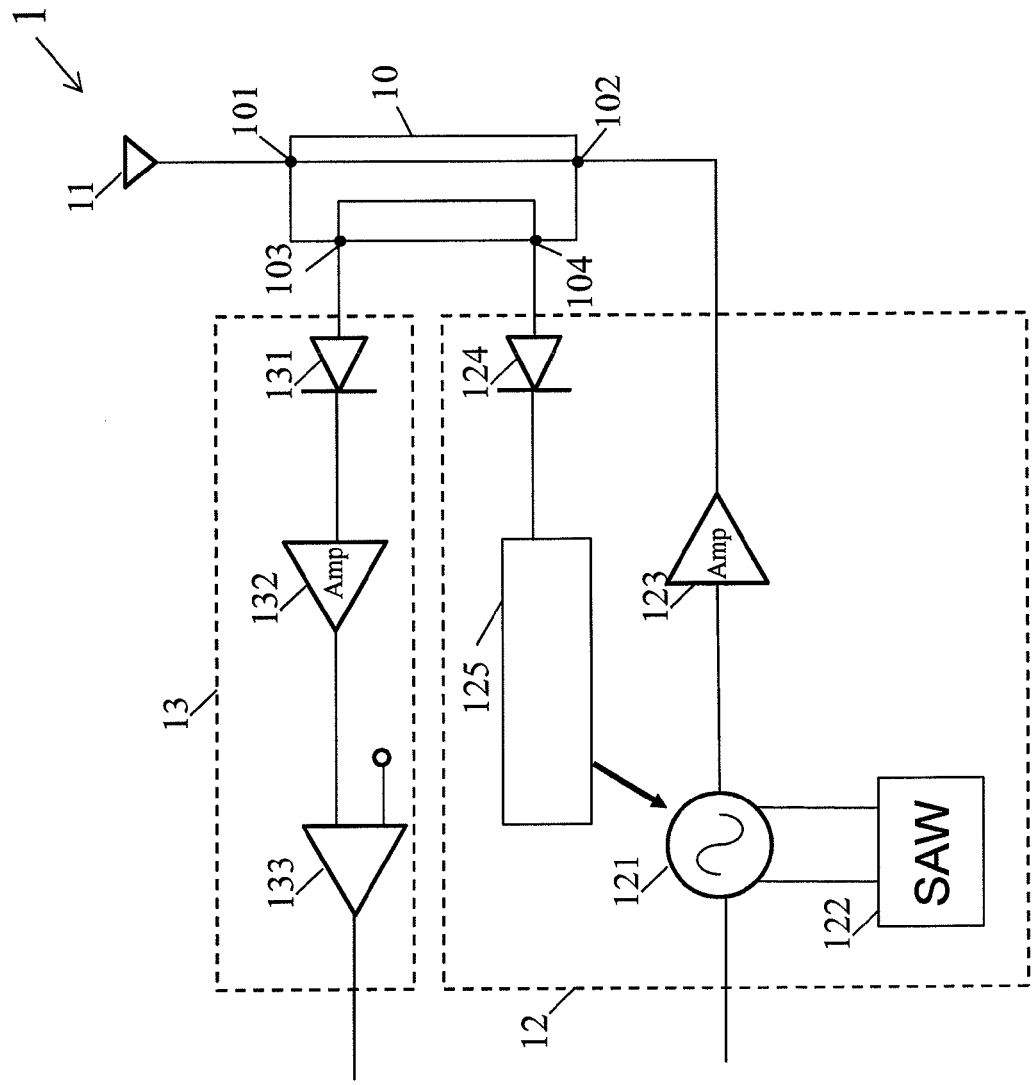
FIG. 1 is a block diagram of a conventional reader 1 in an RFID system.

The transmitter 2 shown in FIGS. 2A and 2B and the transceiver 2' shown in FIG. 3 both use an open-loop control to replace the complex feedback control circuit as illustrated with reference to FIG. 1.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A transmitter in an RFID system, the transmitter comprising:
   a signal generator comprising:
      a carrier generator;
      an amplifier to receive a carrier signal from the carrier generator;
      a PIN diode having an anode connected to an output of the amplifier; and
      a bias circuit having a first terminal to receive a first control signal to control a frequency band of the carrier signal, a second terminal connected to an anode of the PIN diode and the output of the amplifier, and a third terminal connected to a cathode of the PIN diode; and a fourth terminal to receive a second control signal to control a modulation depth of the carrier signal, and
   a directional unit connected to the cathode of the PIN diode, and
      wherein the amplitude of the carrier signal is changed to perform an amplitude-shift-keying (ASK) modulation on the carrier signal according to the first control signal, and the modulation depth of the carrier signal is changed between 0% and 100% according to the second control signal.

2. The transmitter of claim 1, where the bias circuit further comprises:
   a variable resistor being provided with a voltage level;
   a switch connected in series to the variable resistor and electrically coupled to the first terminal of the bias circuit;
   a first resistor connected in parallel to the switch;
   a second resistor connected in series to the first resistor;
   a first inductor having a first terminal connected to the second resistor and a second terminal electrically coupled to the second terminal of the bias circuit; and
   a second inductor having a first terminal electrically coupled to the third terminal of the bias circuit and a second terminal, wherein the second terminal is grounded.

3. The transmitter of claim 2, wherein the bias circuit further comprises a transistor having a first terminal electrically coupled to the fourth terminal of the bias circuit, a second terminal and a third terminal, wherein the second resistor is connected between the second and third terminals.

4. The transmitter of claim 3, wherein the transistor is a complementary metal-oxide-semiconductor (CMOS) transistor.

* * * * *